(12) United States Patent
Yang et al.

(10) Patent No.: US 9,941,143 B2
(45) Date of Patent: Apr. 10, 2018

(54) THIN FILM TRANSISTOR, DISPLAY SUBSTRATE HAVING THE SAME, AND METHOD OF MANUFACTURING THE SAME

(71) Applicant: SAMSUNG DISPLAY CO., LTD., Yongin, Gyeonggi-Do (KR)

(72) Inventors: Chanwoo Yang, Siheung-si (KR); Do-Hyun Kim, Seongnam-si (KR); Jeongju Park, Seoul (KR); Junhyun Park, Suwon-si (KR); Doohyoung Lee, Suwon-si (KR); Xinxing Li, Suwon-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/687,080

(22) Filed: Apr. 15, 2015

(65) Prior Publication Data

US 2015/0333183 A1 Nov. 19, 2015

(30) Foreign Application Priority Data

May 13, 2014 (KR) .................. 10-2014-0057332

(51) Int. Cl.
*H01L 29/786* (2006.01)
*H01L 21/467* (2006.01)
(Continued)

(52) U.S. Cl.
CPC ...... *H01L 21/467* (2013.01); *H01L 21/47573* (2013.01); *H01L 27/1225* (2013.01);
(Continued)

(58) Field of Classification Search
CPC ............... H01L 29/45; H01L 29/41733; H01L 29/78606; H01L 27/1248; H01L 29/7869;
(Continued)

(56) References Cited

U.S. PATENT DOCUMENTS

| | | | |
|---|---|---|---|
| 7,615,867 B2 | 11/2009 | Kim et al. | |
| 8,158,975 B2 | 4/2012 | Akimoto | |
| 8,164,701 B2 | 4/2012 | Kolke et al. | |
| 8,344,387 B2 | 1/2013 | Akimoto et al. | |
| 8,854,583 B2 * | 10/2014 | Kubota | ............... G02F 1/13439 349/122 |

(Continued)

FOREIGN PATENT DOCUMENTS

| | | |
|---|---|---|
| JP | 2001-311954 | 11/2001 |
| JP | 2011-171437 | 9/2011 |

(Continued)

*Primary Examiner* — David Vu
(74) *Attorney, Agent, or Firm* — Lee & Morse, P.C.

(57) ABSTRACT

A thin film transistor include a control electrode, a semiconductor layer on the control electrode, an input electrode, at least a portion of the input electrode being on the semiconductor layer, and an output electrode spaced apart from the input electrode, at least a portion of the output electrode being on the semiconductor layer. Each of the input electrode and the output electrode includes a wiring layer including a metal material, a dummy portion on a side part of the wiring layer, the dummy portion including an oxide of the metal material, and a protection layer on the wiring layer, the protection layer overlapping the wiring layer and the dummy portion.

19 Claims, 11 Drawing Sheets

(51) Int. Cl.
*H01L 29/66* (2006.01)
*H01L 21/4757* (2006.01)
*H01L 29/417* (2006.01)
*H01L 29/45* (2006.01)
*H01L 27/12* (2006.01)

(52) U.S. Cl.
CPC ...... *H01L 27/1248* (2013.01); *H01L 27/1259* (2013.01); *H01L 29/41733* (2013.01); *H01L 29/45* (2013.01); *H01L 29/66969* (2013.01); *H01L 29/7869* (2013.01); *H01L 29/78606* (2013.01); *H01L 27/124* (2013.01)

(58) Field of Classification Search
CPC ............... H01L 27/1259; H01L 27/1225; H01L 27/124
See application file for complete search history.

(56) References Cited

U.S. PATENT DOCUMENTS

2011/0133177 A1* 6/2011 Suzawa ............... H01L 27/1225
257/43
2013/0005081 A1 1/2013 Chen et al.
2013/0048994 A1* 2/2013 Choi ..................... H01L 29/458
257/59

FOREIGN PATENT DOCUMENTS

| KR | 10-0580398 | 5/2006 |
| KR | 10-2013-0021607 | 3/2013 |
| KR | 10-2013-0067201 | 6/2013 |
| KR | 10-2013-0126240 | 11/2013 |

* cited by examiner

THIN FILM TRANSISTOR, DISPLAY SUBSTRATE HAVING THE SAME, AND METHOD OF MANUFACTURING THE SAME

CROSS-REFERENCE TO RELATED APPLICATION

Korean Patent Application No. 10-2014-0057332, filed on May 13, 2014, in the Korean Intellectual Property Office, and entitled: "Thin Film Transistor, Display Substrate Having the Same, and Method of Manufacturing the Same," is incorporated by reference herein in its entirety.

BACKGROUND

1. Field

Embodiments relate to a thin film transistor, a display substrate having the thin film transistor, and a method of manufacturing the display substrate.

2. Description of the Related Art

A display device generally includes a substrate and a plurality of pixels disposed on the substrate. Each pixel may include a thin film transistor connected to a gate line and a data line, which are disposed on the substrate. The thin film transistor receives a gate-on voltage through the gate line and an image signal through the data line.

SUMMARY

Embodiments are directed to a thin film transistor including a control electrode, a semiconductor layer on the control electrode, an input electrode, at least a portion of the input electrode being on the semiconductor layer, and an output electrode spaced apart from the input electrode, at least a portion of the output electrode being on the semiconductor layer, each of the input electrode and the output electrode including a wiring layer including a metal material, a dummy portion on a side part of the wiring layer, the dummy portion including an oxide of the metal material, and a protection layer on the wiring layer and overlapping the wiring layer and the dummy portion.

The semiconductor layer may include an oxide semiconductor.

The protection layer may include a first portion overlapping the wiring layer, and a second portion connected to the first portion and overlapping the dummy portion, the second portion protruding outwardly from the wiring layer when viewed in a plan view.

The semiconductor layer may include an input area overlapping the input electrode, an output area overlapping the output electrode, and a channel area between the input area and the output area, the second portion of the protection layer being disposed adjacent to the channel area.

The input area may entirely overlap the input electrode. The output area entirely overlaps the output electrode.

An upper surface of the channel area may be recessed more than an upper surface of the input area and an upper surface of the output area.

A length of the second portion that protrudes outwardly from the wiring layer may be in a range of from about 1.25% to about 5% of a width of the wiring layer.

The metal material included in the wiring layer may be copper or a copper alloy.

The protection layer may include at least one of indium-zinc oxide, gallium-zinc oxide, and aluminum-zinc oxide.

Each of the input electrode and the output electrode may further include a barrier layer disposed between the semiconductor layer and the wiring layer, the barrier layer including at least one of indium-zinc oxide, gallium-zinc oxide, and aluminum-zinc oxide.

Embodiments are also directed to a display substrate including a base substrate, a thin film transistor including a first electrode layer on the base substrate, a semiconductor layer on the first electrode layer, the semiconductor layer including an oxide semiconductor, and a second electrode layer, at least a portion of the second electrode layer being on the semiconductor layer, and a pixel electrode electrically connected to the thin film transistor. The second electrode layer includes a wiring layer including a metal material, a dummy portion at a side part of the wiring layer, the dummy portion including an oxide of the metal material, and a protection layer on the wiring layer, the protection layer overlapping the wiring layer and the dummy portion.

The protection layer may include a first portion overlapping the wiring layer, and a second portion connected to the first portion and overlapping the dummy portion, the second portion protruding outwardly from the wiring layer when viewed in a plan view.

The protection layer may include at least one of indium-zinc oxide, gallium-zinc oxide, and aluminum-zinc oxide.

The second electrode layer may further include a barrier layer between the semiconductor layer and the wiring layer, the barrier layer including at least one of indium-zinc oxide, gallium-zinc oxide, and aluminum-zinc oxide.

The second electrode layer may include an input electrode and an output electrode that are spaced apart from each other.

The display substrate may further include a gate line on the base substrate, the gate line extending in a first direction and being connected to the second electrode layer, and a data line on the base substrate, the data line extending in a second direction substantially perpendicular to the first direction and being connected to the first electrode layer. The data line may have a same structure as the second electrode layer and may entirely overlap the semiconductor layer.

Embodiments are also directed to a method of manufacturing a display substrate including forming a first electrode layer on a base substrate, forming a semiconductor layer, a barrier layer, a wiring layer, and a protection layer on the first electrode layer, forming a first photoresist layer pattern on the protection layer, selectively etching the semiconductor layer, the barrier layer, the wiring layer, and the protection layer using the first photoresist layer pattern as a mask to form a first structure including a semiconductor pattern, a barrier pattern, a wiring pattern, and a protection pattern, etching the first photoresist layer pattern to form a second photoresist layer pattern that exposes a portion of the first structure, the exposed portion of the first structure overlapping the first electrode layer, etching the exposed portion of the first structure using the second photoresist layer pattern as a mask to form a second structure including the semiconductor pattern, the barrier pattern, a wiring pattern a portion of which is removed in an area corresponding to the exposed portion of the first structure, and a protection pattern, a portion of which is removed in the area corresponding to the exposed portion of the first structure, and plasma-treating the exposed portion of the semiconductor pattern to form a thin film transistor, wherein the protection pattern, from which a portion has been partially removed, protrudes outwardly from the wiring pattern, which is partially removed.

Forming the first structure may be performed using a first etchant. An etching speed of the protection pattern against the first etchant may be slower than an etching speed of the wiring pattern against the first etchant.

Forming the second structure may be performed using a second etchant. The etching speed of the protection pattern against the second etchant may be slower than the etching speed of the wiring pattern against the second etchant.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
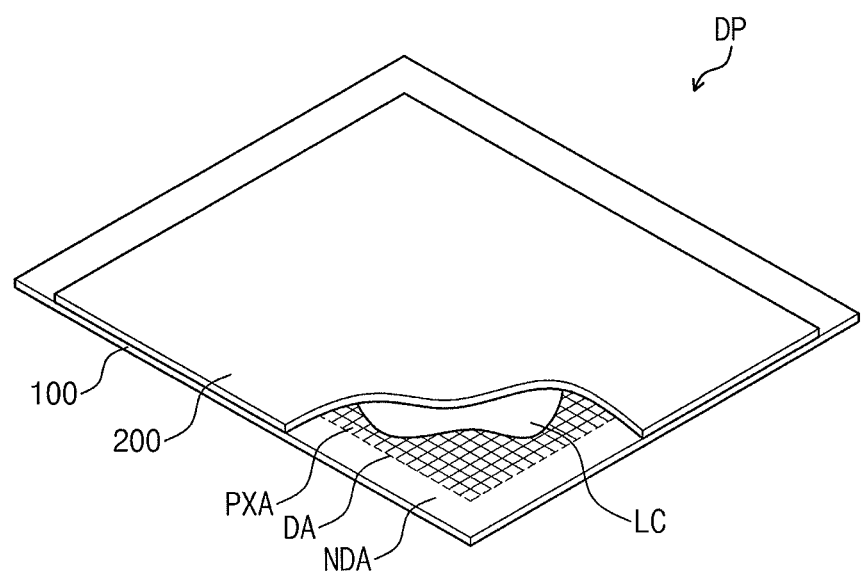
FIG. 1 illustrates a perspective view showing a display panel including a display substrate according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" comprises any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms, "a", "an" and "the" are intended to include the plural forms as well, unless the context clearly indicates otherwise. It will be further understood that the terms "comprises" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a perspective view showing a display panel DP including a display substrate according to an exemplary embodiment. FIG. 1 shows a liquid crystal display panel as a representative example of the display panel DP.

Referring to FIG. 1, the display panel DP may include a first substrate 100, a second substrate 200, and a liquid crystal layer LC interposed between the first substrate 100 and the second substrate 200.

In the present exemplary embodiment, the first substrate 100 corresponds to the display substrate according to the present disclosure, and thus the first substrate 100 is referred to as the display substrate. The display substrate 100 may include a display area DA and a non-display area NDA. The display area DA may include a plurality of pixel areas PXA. Each of the pixel areas PXA may include a pixel displaying an image.

The non-display area NDA, which does not display an image, may be disposed adjacent to the display area DA. The non-display area NDA may include a driver applying a voltage to the pixels and pad areas electrically connecting the display substrate and the driver.

Hereinafter, the second substrate 200 is referred to as an opposite substrate. The opposite substrate 200 may be disposed on the display substrate 100. In other implementations, the opposite substrate 200 may be disposed under the display substrate 100.

The opposite substrate 200 may receive a voltage from an external source. In other implementations, the opposite substrate 200 may serve as a protection substrate to protect the display substrate 100. In this case, voltages having different voltage levels may be applied to the display substrate 100, and no voltage is applied to the opposite substrate 200.

The liquid crystal layer LC includes liquid crystal molecules having a dielectric anisotropy. The liquid crystal molecules may be rotated in a specific direction between the display substrate 100 and the opposite substrate 200 when an electric field is applied to the liquid crystal layer LC. Thus, a transmittance of a light passing through the liquid crystal layer LC may be controlled. According to another embodiment, the liquid crystal layer LC may be driven by the different voltages applied to the display substrate 100, and thus the transmittance of the light passing through the liquid crystal layer LC may be controlled.

Figure 2:
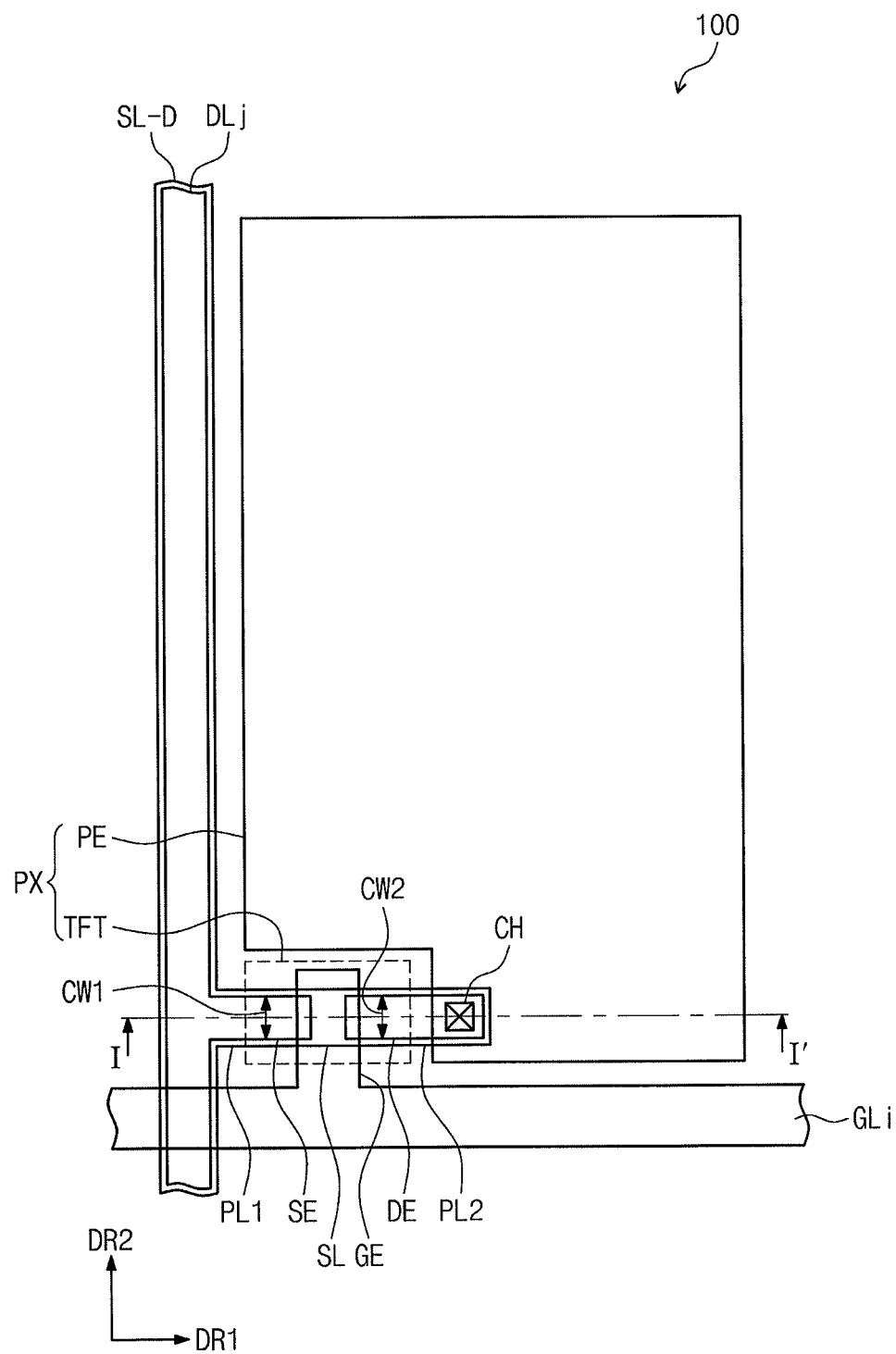
FIG. 2 illustrates a plan view showing a portion of the display substrate according to an exemplary embodiment.
Figure 3:
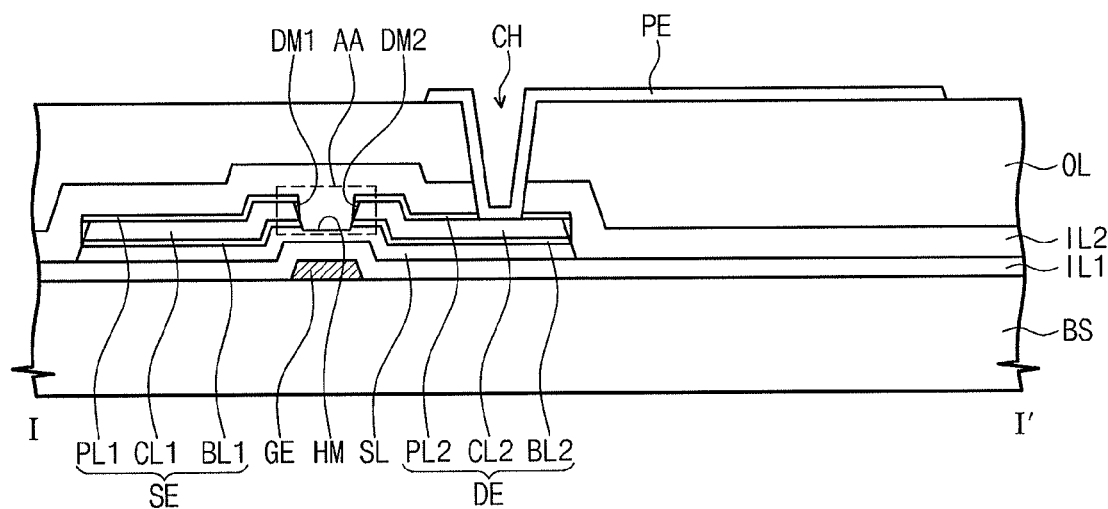
FIG. 3 illustrates a cross-sectional view taken along a line I-I' of FIG. 2.
Figure 4:
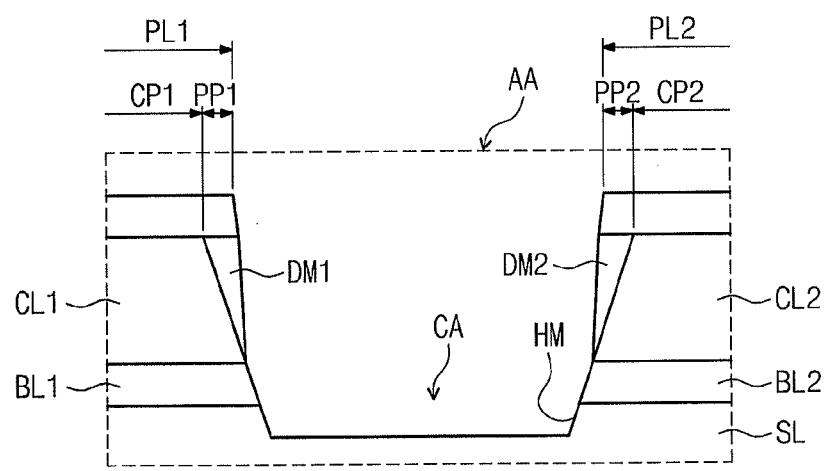
FIG. 4 illustrates an enlarged cross-sectional view showing a portion AA of FIG. 3.

FIG. 2 illustrates a plan view showing a portion of the display substrate 100, FIG. 3 illustrates a cross-sectional view taken along a line I-I' of FIG. 2, and FIG. 4 illustrates an enlarged cross-sectional view showing a portion AA of FIG. 3.

Referring to FIGS. 2 to 4, the display substrate 100 may include a base substrate BS, a data line DLj, a gate line GLi, a thin film transistor TFT, and a pixel electrode PE.

The base substrate BS may include a transparent glass or plastic. The data line DLj may extend in a second direction DR2 on the base substrate BS. The data line DLj may be arranged in a first direction DR1 crossing the second direction DR2. The gate line GLi may extend in the first direction DR1. The gate line GLi may be insulated from the data line DLj.

In the present exemplary embodiment, the display substrate 100 may further include a semiconductor line SL-D extending in the second direction DR2. The semiconductor line SL-D may overlap the data line DLj when viewed in a plan view. In FIG. 2, the semiconductor line SL-D is shown as having an area greater than that of the data line DLj, as an example. In other implementations, the semiconductor line SL-D may have the same area and shape as the data line DLj.

In FIG. 2, one data line DLj and one gate line GLi are shown as representative examples, however, the gate line GLi and the data line DLj may be provided in plural numbers. The data line DLj and the gate line GLi may be disposed adjacent to the pixel PX.

The thin film transistor TFT includes a control electrode GE, an input electrode SE, an output electrode DE, and a semiconductor layer SL. The semiconductor layer SL may be disposed on the base substrate BS. The semiconductor layer SL may overlap the control electrode GE and may be electrically connected to the input electrode SE and the output electrode DE.

The control electrode GE may protrude from the gate line GLi. The control electrode GE may be a gate electrode. Each of the control electrode GE and the gate line GLi may have a single-layer structure or a multi-layer structure. The control electrode GE may include the same material as the gate line GLi.

The control electrode GE may include one or more layers including an aluminum-containing metal such as aluminum (Al) or an aluminum alloy, a silver-containing metal such as silver (Ag) or a silver alloy, a copper-containing metal such as copper (Cu) or a copper alloy, a molybdenum-containing metal such as molybdenum (Mo) or a molybdenum alloy, chromium (Cr), titanium (Ti), tantalum (Ta), or manganese (Mn).

The display substrate 100 further may include a first insulating layer IL1 disposed on the control electrode GE. The first insulating layer IL1 may include an insulating material, such as silicon oxide (SiOx) or silicon nitride (SiNx).

The first insulating layer IL1 may insulate the input electrode SE and the output electrode DE from the control electrode GE. The gate lines may be insulated from the data lines while crossing the data lines by the first insulating layer IL1 interposed between the gate lines and the data lines.

The semiconductor layer SL may be disposed on the first insulating layer IL1. The semiconductor layer SL may overlap the control electrode GE. The semiconductor layer SL may protrude from the semiconductor line SL-D. The semiconductor layer SL may be overlapped by the input electrode SE and the output electrode DE.

The semiconductor layer SL may include an oxide semiconductor material. The oxide semiconductor material may include at least one of zinc (Zn), indium (In), tin (Sn), and gallium (Ga). For instance, the semiconductor layer SL may include indium-gallium-zinc oxide (IGZO).

The input electrode SE may protrude from a portion of the data line DLj in the first direction DR1. The input electrode SE may be spaced apart from the output electrode DE. When viewed in a plan view, a portion of the input electrode SE and a portion of the output electrode DE may overlap the semiconductor layer SL.

The input electrode SE may receive a data voltage from the data line DLj, and the output electrode DE may receive a voltage applied through the semiconductor layer SL. Each of the input electrode SE and the output electrode DE may include the same material as the data line DLj and may have the same layer structure as the data line DLj.

The input electrode SE may have a predetermined width CW1, and the output electrode DE may have a predetermined width CW2. The width CW1 of the input electrode SE and the width CW2 of the output electrode DE are measured in a direction that is substantially perpendicular to a direction in which the input electrode SE and the output electrode DE extend. In the present exemplary embodiment, the width CW1 of the input electrode SE and the width CW2 of the output electrode DE are measured in the direction substantially in parallel to the second direction DR2.

The input electrode SE and the output electrode DE may be disposed on the semiconductor layer SL such that a portion of the semiconductor layer SL is exposed. A groove HM may be defined at a portion of the exposed area of the semiconductor layer SL.

A step difference may be formed between an upper surface of the groove HM and an upper surface of the semiconductor layer SL disposed adjacent to the groove HM. The groove HM may have a depth that varies depending on variations in the manufacturing process.

A channel area CA of the thin film transistor TFT may be defined in the groove HM. The channel area CA may be used as a path through which electric charges move. The voltage provided through the input electrode SE may be applied to the output electrode DE through the channel area CA. Electrical characteristics of the channel area CA may vary depending on a difference in depth of the groove HM, which may be caused by the variations in the manufacturing process.

The input electrode SE and the output electrode DE may include barrier layers BL1 and BL2, wiring layers CL1 and CL2, and protection layers PL1 and PL2. Each of the input electrode SE and the output electrode DE may have a triple-layer structure. In addition, as described above, the data line DLj may have the same layer structure as the input electrode SE and the output electrode DE. Accordingly, the data line DLj may have the triple-layer structure.

The wiring layers CL1 and CL2 may include a conductive material. The first wiring layer CL1 may have the same material and the same layer structure as a second wiring layer CL2, which serves as a portion of the output electrode DE. For example, the wiring layers CL1 and CL2 may include at least one metal material, e.g., copper (Cu) or a copper alloy.

The barrier layers BL1 and BL2 may be disposed between the semiconductor layer SL and the wiring layers CL1 and CL2. The barrier layers BL1 and BL2 may prevent the metal material included in the wiring layers CL1 and CL2 from diffusing into the semiconductor layer SL.

The barrier layers BL1 and BL2 may include a first barrier layer BL1 disposed under the first wiring layer CL1 and a second barrier layer BL2 disposed under the second wiring layer CL2. In some implementations, the barrier layers BL1 and BL2 may be omitted.

Each of the first and second barrier layers BL1 and BL2 may include at least one of vanadium (V), zirconium (Zr), tantalum (Ta), manganese (Mn), magnesium (Mg), chromium (Cr), molybdenum (Mo), cobalt (Co), niobium (Nb), and nickel (Ni), or may include at least one of indium-zinc oxide (IZO), gallium-zinc oxide (GZO), and aluminum-zinc oxide (AZO).

The protection layers PL1 and PL2 may be respectively disposed on the wiring layers CL1 and CL2. The protection layers PL1 and PL2 may include a first protection layer PL1 disposed on the first wiring layer CL1 and a second protection layer PL2 disposed on the second wiring layer CL2.

The first and second protection layers PL1 and PL2 may cover upper surfaces of the first wiring layer CL1 and the second wiring layer CL2, respectively. The first and second protection layers PL1 and PL2 may prevent characteristics of the thin film transistor TFT from being deteriorated due to changes of the first and second wiring layers CL1 and CL2.

The first and second protection layers PL1 and PL2 may include a metal oxide. For instance, the first and second protection layers PL1 and PL2 may include at least one of indium-zinc oxide (IZO), gallium-zinc oxide (GZO), and aluminum-zinc oxide (AZO).

A portion of the first protection layer PL1 and a portion of the second protection layer PL2 may protrude outwardly from the first and second wiring layers CL1 and CL2, respectively. The protruded portions of the first and second protection layers PL1 and PL2 are referred to as a first protrusion portion PP1 and a second protrusion portion PP2, respectively.

A side part of each of the input electrode SE and the output electrode DE will be described in detail with reference to FIG. 4. FIG. 4 shows only the side part of the input electrode SE and the output electrode DE that is disposed adjacent to the groove HM. However, the other or opposite side part of the input electrode SE and the output electrode DE may have the same structure as that of the side part disposed adjacent to the groove HM.

Dummy portions DM1 and DM2 may be respectively disposed on side parts of the wiring layers CL1 and CL2. A first dummy portion DM1 may be disposed on the side part of the first wiring layer CL1 and a second dummy portion DM2 may be disposed on the side part of the second wiring layer CL2. The first and second dummy portions DM1 and DM2 may be attached to the first and second wiring layers CL1 and CL2, respectively.

Each of the first and second dummy portions DM1 and DM2 may include an oxide of the metals included in the wiring layers CL1 and CL2. For instance, the dummy portions DM1 and DM2 may include copper oxide (CuOx) or a copper alloy oxide. The first and second dummy portions DM1 and DM2 may cover at least portions of the side parts of the first and second wiring layers CL1 and CL2, respectively.

When viewed in a plan view, the first protection layer PL1 may include a first portion CP1 and a second portion PP1 connected to the first portion CP1. The first portion CP1 may correspond to a first center portion disposed at a center area of the first protection layer PL1 when viewed in a plan view, and thus, the first portion CP1 is referred to as the first center portion. The second portion PP1 corresponds to a first protrusion portion that protrudes outwardly from the first wiring layer CL1 when viewed in a plan view, and thus the second portion PP1 is referred to as the first protrusion portion. The first center portion CP1 may overlap the upper surface of the first wiring layer CL1 and the first protrusion portion PP1 may overlap the first dummy portion DM1.

The second protection layer PL2 may have the same structure as the first protection layer PL1. The second protection layer PL2 may include a second center portion CP2 overlapping the second wiring layer CL2 and a second protrusion portion PP2 overlapping the second dummy portion DM2.

The first dummy portion DM1 may have a size different from a size of the second dummy portion DM2. The first and second protrusion portions PP1 and PP2 may prevent the size of the first and second dummy portions DM1 and DM2 from increasing. The first and second dummy portions DM1 and DM2 may not extend to upper sides of the first and second protrusion portions PP1 and PP2, respectively as will be described below.

As a length of the first and second protrusion portions PP1 and PP2 becomes longer, an area of the first and second protrusion portions PP1 and PP2 that overlaps the groove HM, increases. When the area of the first and second protrusion portions PP1 and PP2 overlapping the groove HM increases, a plasma treatment process on the channel area CA may become difficult.

The length of the first and second protrusion portions PP1 and PP2 may vary as long as the first and second protrusion portions PP1 and PP2 prevent the size of the first and second dummy portions DM1 and DM2 from increasing and do not exert a negative influence on the plasma treatment process performed on the channel area CA. For instance, the length of the first and second protrusion portions PP1 and PP2 may correspond to about 1.25% to about 5% of the width of the wiring layer.

The width CW1 (refer to FIG. 2) of the input electrode SE may correspond to the width of the first wiring layer CL1. The width CW2 (refer to FIG. 2) of the output electrode DE may correspond to the width of the second wiring layer CL2. The first and second protrusion portions PP1 and PP2 may respectively protrude outwardly from the center portions CP1 and CP2 to have a length within the range from about 1.25% to about 5% of the widths CW1 and CW2 of the wiring layers CL1 and CL2.

Referring again to FIG. 3, the display substrate 100 according to the present exemplary embodiment may further include a second insulating layer IL2 disposed on the first insulating layer IL1 and the control electrode GE. The second insulating layer IL2 may include an insulating material, such as silicon oxide (SiOx) or silicon nitride (SiNx).

The second insulting layer IL2 may insulate the input electrode SE and the output electrode DE from other elements.

The display substrate 100 may further include an organic layer OL disposed on the second insulating layer IL2. The organic layer OL may include at least one organic material. The organic layer OL may planarize an upper surface of the second insulating layer IL2 to provide a planarized surface thereon.

The organic layer OL may be a color filter layer having at least one color. The organic layer OL may be disposed to correspond to the pixel area to assign a color to the light passing through the pixel area. The organic layer OL may include at least one of a red color, a green color, and a blue color.

The pixel electrode PE may be disposed on the organic layer OL. A contact hole CH may be formed through the organic layer OL and the second insulating layer IL2 to expose a portion of the upper surface of the output electrode DE. The pixel electrode PE may be electrically connected to the thin film transistor TFT through the contact hole CH. The pixel electrode PE may receive the data voltage through the second wiring layer CL2, which serves as the portion of the output electrode DE.

The pixel electrode PE may be a transparent electrode. For instance, the pixel electrode PE may include a transparent conductive oxide material, such as indium-tin oxide (ITO), indium-zinc oxide (IZO), etc. Although not shown in figures, the pixel electrode PE may include a plurality of slits.

A common electrode may be disposed on the opposite substrate 200 (refer to FIG. 1). The common electrode may form an electric field in cooperation with the pixel electrode PE. The liquid crystal layer LC (refer to FIG. 1) may be controlled by the electric field.

In other implementations, the display substrate 100 may include the common electrode. In this case, the common electrode may be disposed on or under the pixel electrode PE.

The display substrate 100 may further include a third insulating layer disposed on the organic layer OL. The third insulating layer may cover the pixel electrode PE. The third insulating layer may be an alignment layer. The alignment layer may control an alignment of the liquid crystal molecules of the liquid crystal layer LC disposed on the display substrate 100.

FIGS. 5A to 5I illustrate cross-sectional views showing stages of a manufacturing method of the display substrate according to an exemplary embodiment. In FIGS. 5A to 5I, the same reference numerals denote the same elements in FIGS. 1 to 4, and thus, the detailed descriptions of the same elements will not be repeated.

Figure 5A:
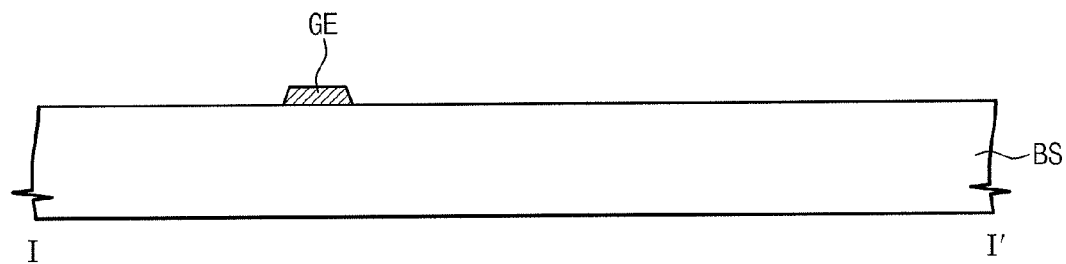
FIGS. 5A to 5I illustrate cross-sectional views showing stages of a manufacturing method of the display substrate according to an exemplary embodiment.

Referring to FIG. 5A, the control electrode GE may be formed on the base substrate BS. Gate lines may be substantially simultaneously formed together with the control electrode GE. The control electrode GE and the gate lines may be formed by patterning a conductive layer through a photolithography process, as an example. Formation of the control electrode GE and the gate lines may include a deposition process or a sputtering process.

Figure 5B:
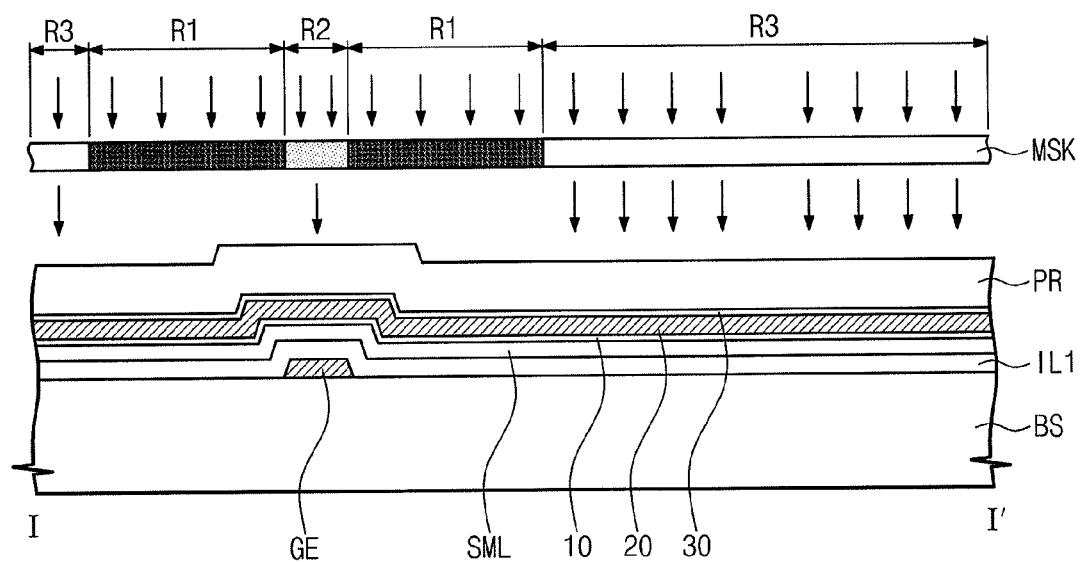
Figure 5C:
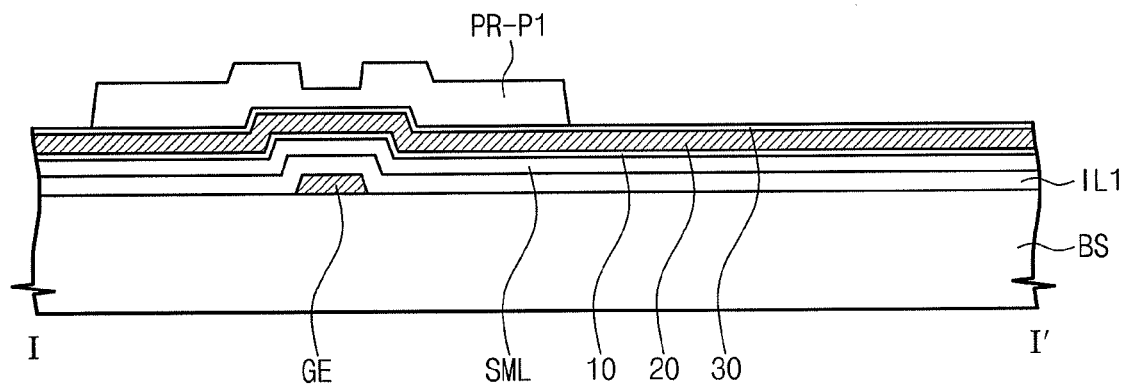

Referring to FIGS. 5B and 5C, the first insulating layer IL1, a semiconductor material layer SML including a semiconductor material, a barrier layer 10, a wiring layer 20, a protection layer 30, and a photoresist layer PR are sequentially deposited on the control electrode GE. The first insulating layer IL1, the semiconductor material layer SML, the barrier layer 10, the wiring layer 20, and the protection layer 30 may be formed by a deposition process. The photoresist layer PR may be formed by coating a liquid photoresist material on the protection layer 30. The photoresist layer PR may be a positive photoresist material.

Light may be irradiated onto the photoresist layer PR through a mask MSK. A halftone mask may be used as the mask MSK. The mask MSK may include a first area R1 blocking the irradiated light, a second area R2 partially transmitting the irradiated light, and a third area R3 transmitting the irradiated light without blocking the irradiated light. The light may be irradiated onto the photoresist layer PR after passing through the mask MSK.

The photoresist layer PR exposed to the light through the mask MSK may be developed to form a first photoresist layer pattern PR-P1. The first photoresist layer pattern PR-P1 may be formed by completely removing the photoresist layer PR corresponding to the third area R3. An amount of the light irradiated onto the second area R2 may be smaller than an amount of the light irradiated onto the third area R3. Accordingly, the photoresist layer PR corresponding to the second area R2 may have a thickness smaller than that of the photoresist layer PR corresponding to the first area R1.

On the other hand, when the photoresist layer PR is formed with a negative photoresist, the photoresist layer pattern may be formed only in the light blocking area.

Figure 5D:
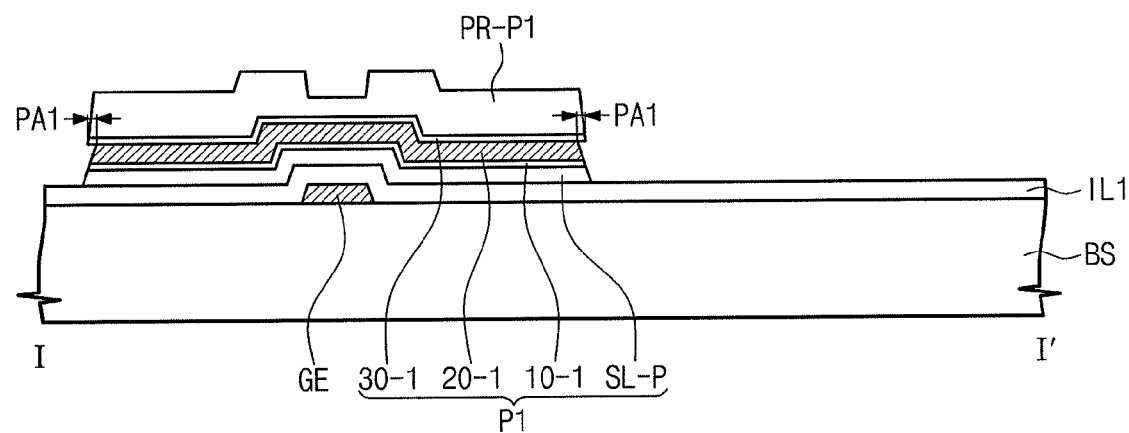

Referring to FIG. 5D, portions of the semiconductor material layer SML, the barrier layer 10, the wiring layer 20, and the protection layer 30 that are not covered by the first photoresist layer pattern PR-P1 may be removed using the first photoresist layer pattern PR-P1 as a mask. After the exposed portions not covered by the first photoresist layer pattern PR-P1 are removed, a first structure P1 may be formed.

The first structure P1 may be formed a suitable method. For instance, the first structure P1 may be formed by increasing the crystallinity of the protection layer 30 in a thickness direction. In addition, the first structure P1 may be formed by increasing adhesive force between the protection layer 30 and the first photoresist layer pattern PR-P1. In the present exemplary embodiment, a method of forming the first structure P1 may include using a first etchant (not shown) having a different reactivity against each layer.

The first etchant may react with each of the semiconductor material layer SML, the barrier layer 10, the wiring layer 20, and the protection layer 30. In the present exemplary embodiment, the first etchant may include a material having a reactivity against the protection layer 30 that is lower than a reactivity against the wiring layer 20. Accordingly, under the same conditions, the etching speed of the protection layer 30 may be slower than the etching speed of the wiring layer 20 when using the first etchant.

The portions of the semiconductor material layer SML, the barrier layer 10, the wiring layer 20, and the protection layer 30 that are not covered by the first photoresist layer pattern PR-P1 may react with the first etchant and may be gradually etched. When the protection layer 30 is etched by the first etchant to expose the wiring layer 20, the wiring layer 20 may be etched faster than the etching speed of the protection layer 30. The wiring layer 20 may be etched to expose the barrier layer 10, and then, the semiconductor material layer SML, the barrier layer 10, the wiring layer 20, and the protection layer 30 may be substantially simultaneously etched.

The first etchant may react with the semiconductor material layer SML to form a semiconductor pattern SL-P and may with the barrier layer 10 to form a barrier pattern 10-1.

In addition, the first etchant may react with the wiring layer 20 to form a wiring pattern 20-1 and may react with the protection layer 30 to form a protection pattern 30-1. The semiconductor pattern SL-P, the barrier pattern 10-1, the wiring pattern 20-1, and the protection pattern 30-1 may form the first structure P1.

In this case, the protection layer 30 may be less etched than the wiring layer 20 due to the difference of the etching speed. The wiring layer 20 may be etched inwardly from a side part PA1 of the first photoresist layer pattern PR-P1 more than the protection layer 30. Consequently, the protection pattern 30-1 may protrude outwardly from the wiring pattern 20-1 when viewed in a plan view.

In other implementation, the semiconductor material layer SML, the barrier layer 10, the wiring layer 20, and the protection layer 30 may be sequentially etched using different kinds of etchants instead of using the first etchant. The etchants may be selected to allow the protection layer 30 to be etched less than the other layers considering the etching speed of the layers against the etchants when the first structure P1 is formed.

Figure 5E:
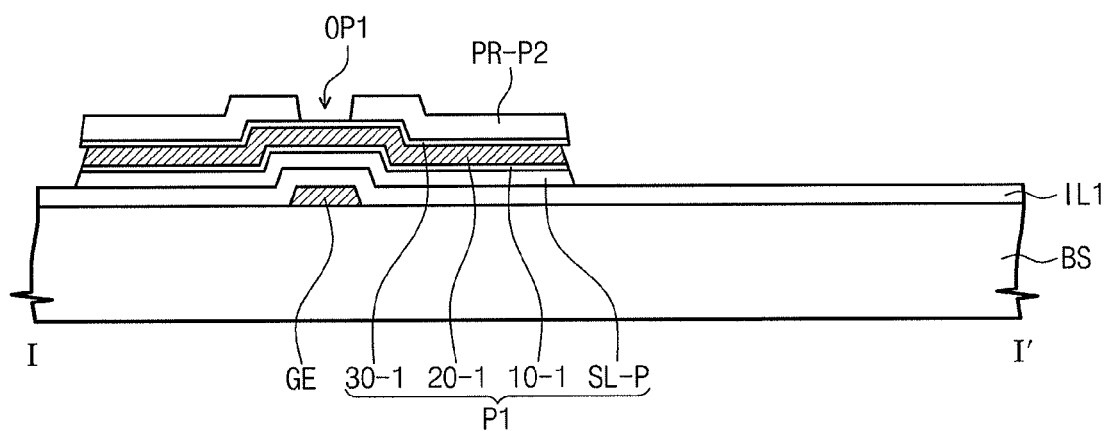

Referring to FIG. 5E, the first photoresist layer pattern PR-P1 may be etched to form a second photoresist layer pattern PR-P2. An entire area of the first photoresist layer pattern PR-P1 may be etched with the same etching speed from an upper surface thereof.

Thus, a portion of the first photoresist layer pattern PR-P1, which has a relatively thin thickness, may be completely removed. In the present exemplary embodiment, a first opening OP1 may be formed through the first photoresist layer pattern PR-P1 to expose a portion of the first structure P1, which overlaps the control electrode GE, and thus, a second photoresist layer pattern PR-P2 may be formed.

Figure 5F:
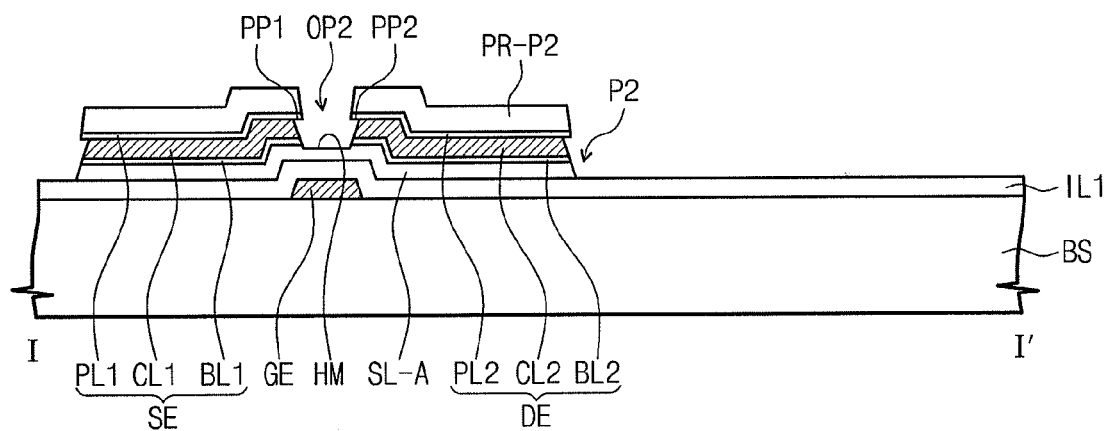

Referring to FIG. 5F, the first structure P1 may be etched using the second photoresist layer pattern PR-P2 as a mask to form a second structure P2. The portion of the first structure P1 exposed by the second photoresist layer pattern PR-P2 may be etched to form the second structure P2. In this case, an area of the first structure P1 corresponding to the first opening OP1 may be mainly etched to define a second opening OP2 in the second structure P2.

A second etchant may include the same material as the first etchant or may include a material having a lower reactivity against the semiconductor pattern SL-P than the first etchant. The protection pattern 30-1 may be etched more slowly than the wiring pattern 20-1.

The second etchant may react with the protection pattern 30-1 to remove a portion of the protection pattern 30-1 that corresponds to the second opening OP2, to thereby form the first protection layer PL1 and the second protection layer PL2. The second etchant may react with the wiring pattern 20-1 to remove a portion of the wiring pattern 20-1 that corresponds to the second opening OP2, to thereby form the first wiring layer CL1 and the second wiring layer CL2. In addition, the second etchant may react with the barrier pattern 10-1 to remove a portion of the barrier pattern 10-1 that corresponds to the second opening OP2, to thereby form the first barrier layer BL1 and the second barrier layer BL2.

The first and second protection layers PL1 and PL2, the first and second wiring layers CL1 and CL2, and the first and second barrier layers BL1 and BL2 may form the second structure P2. The method of forming the second structure P2 may be substantially the same as the method of forming the first structure P1 (refer to FIG. 5D). Accordingly, details thereof will not be repeated.

A portion of the semiconductor pattern SL-P may be etched by the second etchant. The first structure P1 may not include a separate etch stopper in the area corresponding to the first opening OP1. Thus, a portion of the channel area may be etched by the second etchant.

The semiconductor pattern SL-P may be etched by the second etchant in the area overlapping the second opening OP2 to form a semiconductor pattern SL-A. An area of the semiconductor pattern SL-A that corresponds to the second opening OP2 may be recessed. Thus, a step difference may occur between the area of the semiconductor pattern SL-A and the other areas thereof, to thereby form the groove HM. The depth of the groove HM may be controlled depending on the reactivity and the etching speed of the second etchant.

The second photoresist layer pattern PR-P2 may be removed using an ashing process and/or a strip process.

Figure 5G:
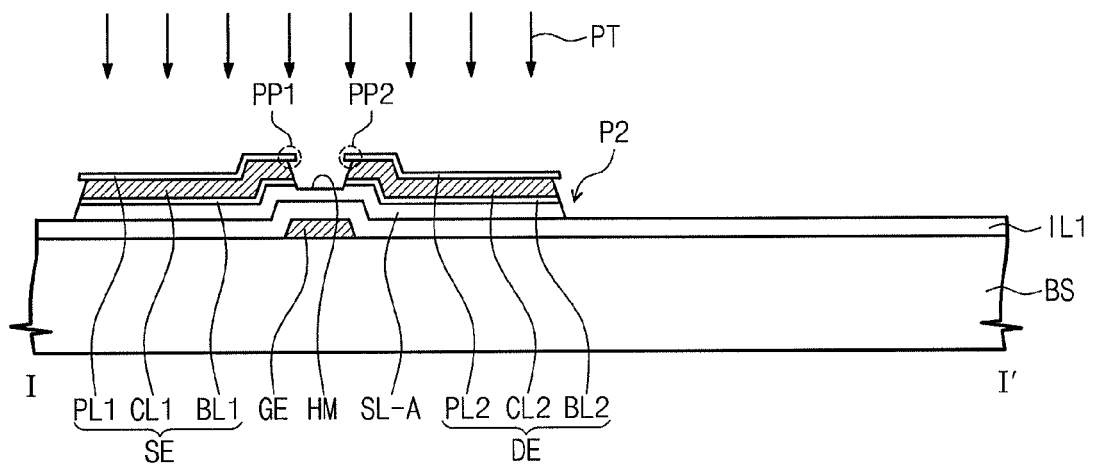
Figure 5H:
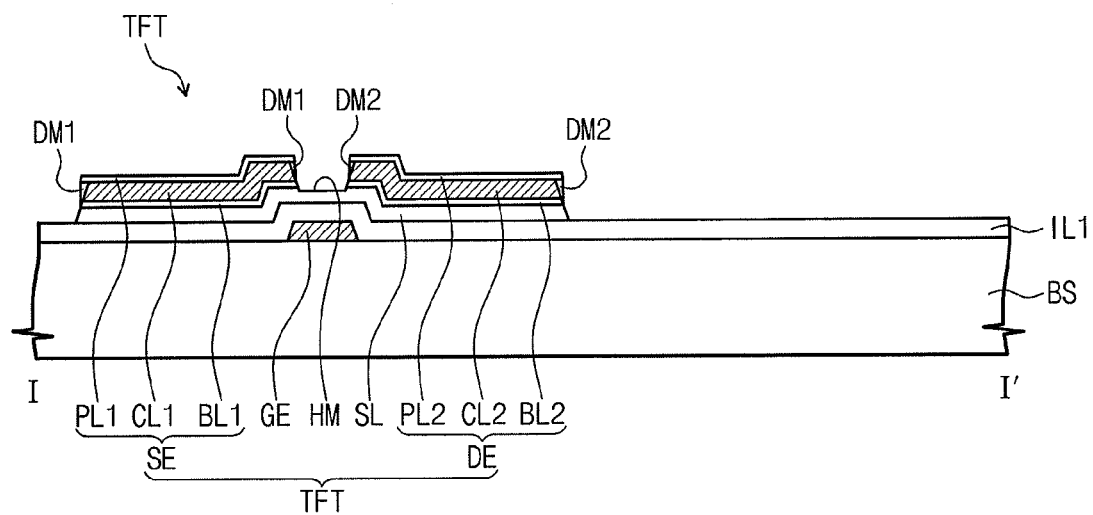

Referring to FIGS. 5G and 5H, a plasma treatment may be performed to form the thin film transistor TFT. A predetermined plasma gas PT may be provided on an upper portion of the second structure P2. The plasma gas PT may include one of nitrogen oxide (NxO) and oxygen ($O_2$).

The semiconductor pattern SL-A, from which the portion corresponding to the second opening OP2 has been removed, may be plasma-treated to form a semiconductor layer SL that is surface treated. The plasma gas PT may improve characteristics of the groove HM. The groove HM corresponds to the channel area CA, as described above.

The semiconductor layer SL may prevent the channel area CA from being damaged due to the contact between the channel area CA and a passivation layer when the channel area CA is exposed to the passivation layer, described below. For instance, damage to the channel area CA, which may be caused by the electric charge accumulation or the deposition process of the passivation layer, may be prevented.

The dummy portions DM1 and DM2 may be attached to the thin film transistor TFT. The plasma gas PT may react with side surfaces of the first and second wiring layers CL1 and CL2 to oxidize the side surfaces of the first and second wiring layers CL1 and CL2. The first and second wiring layers CL1 and CL2 may react with the plasma gas PT to form the dummy portions DM1 and DM2.

The dummy portions DM1 and DM2 may have a size that increases as the plasma treatment time is increased. The protrusion portions PP1 and PP2 may protrude outwardly from the first and second wiring layers CL1 and CL2 when viewed in a plan view. The protrusion portions PP1 and PP2 may serve as a blocking layer that prevents the size of the dummy portions DM1 and DM2 from increasing more than a predetermined size. The dummy portions DM1 and DM2 may contact the protrusion portions PP1 and PP2. Accordingly, the protrusion portions PP1 and PP2 may prevent the dummy portions DM1 and DM2 from increasing in an upper direction from the first and second wiring layers CL1 and CL2.

The dummy portions DM1 and DM2 may diffuse metal included in the first and second wiring layers CL1 and CL2 to other layers adjacent thereto. Thus, damage caused by the metal diffused to the channel area may be prevented by restricting the growth of the first and second dummy portions DM1 and DM2.

In addition, the protrusion portions PP1 and PP2 may prevent the side surface of the first and second wiring layers CL1 and CL2 from directly making contact with the plasma gas PT. Accordingly, a physical collision between the plasma gas PT and the first and second wiring layers CL1 and CL2 may be reduced. The side surfaces of the first and second wiring layers CL1 and CL2 may be prevented from contacting the plasma gas PT and being damaged during the plasma treatment process.

Figure 5I:
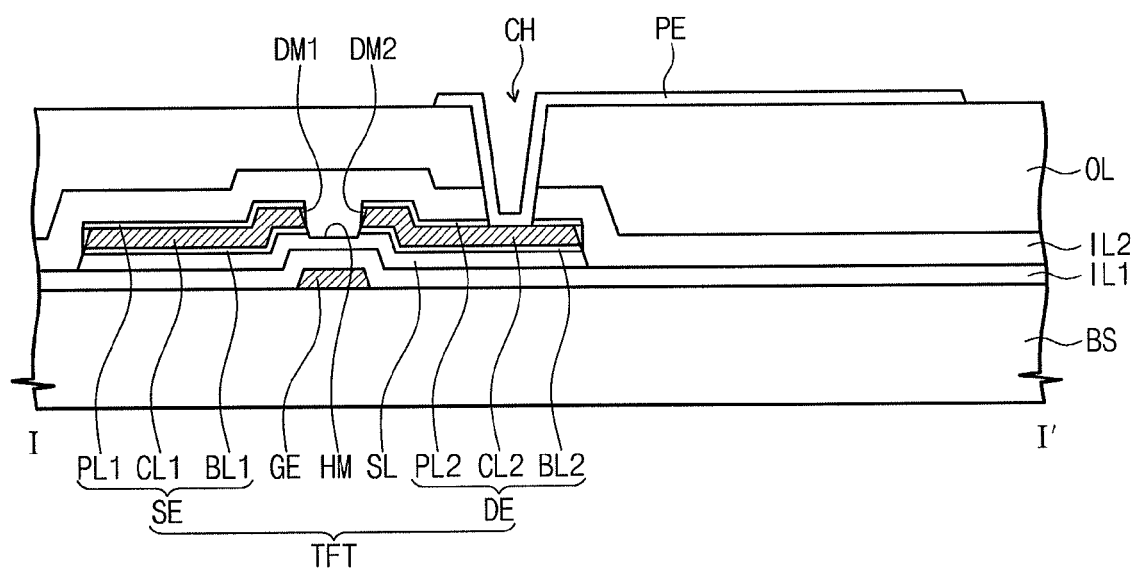

Referring to FIG. 5I, the organic layer OL may be formed on the thin film transistor TFT. The organic layer OL may be formed by coating an organic material on the thin film transistor TFT and drying the organic material. The organic layer OL may provide a planarized surface on an upper portion thereof.

The second insulating layer IL2 may be formed between the thin film transistor TFT and the organic layer OL. The second insulating layer L2 may insulate the thin film transistor TFT from the other elements and may prevent moisture of the organic layer OL from entering the thin film transistor TFT.

In the thin film transistor TFT according to the present exemplary embodiment, the dummy portions DM1 and DM2 may not extend to the upper portion of the input electrode SE and the output electrode DE. Accordingly, the input electrode SE and the output electrode DE may provide a planarized surface on the second insulating layer IL2. Defects, e.g., cracks, seams, etc., of the second insulating layer IL2 that may be caused by the dummy portions DM1 and DM2 may be prevented.

The contact hole CH may be formed to penetrate through the organic layer OL and the second insulating layer IL2. The contact hole CH may be formed through the area overlapping the output electrode DE.

The pixel electrode PE may be formed on the organic layer OL. The pixel electrode PE may be connected to the output electrode DE through the contact hole CH. The pixel electrode PE may be formed by depositing a transparent conductive material.

Figure 6A:
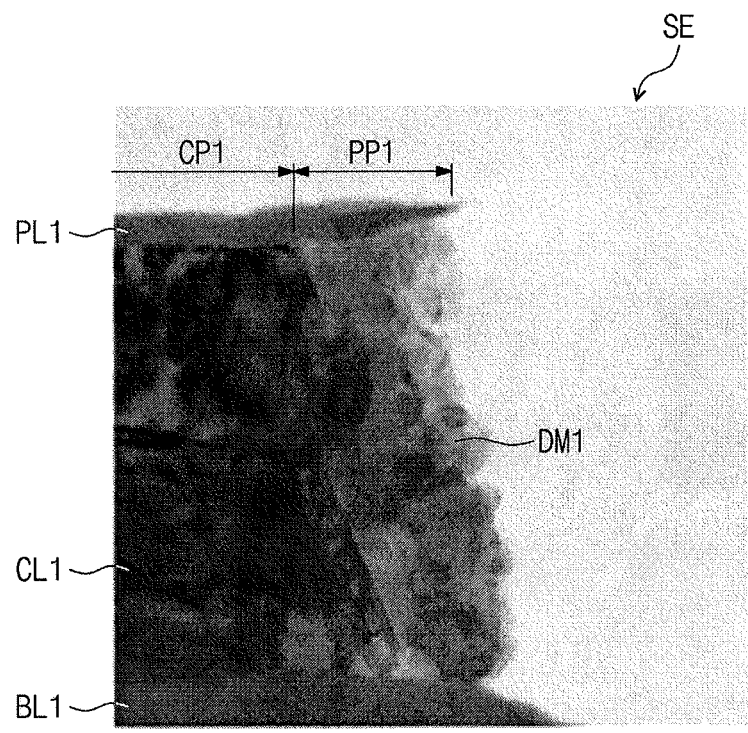
FIG. 6A illustrates a TEM image showing a portion of a thin film transistor according to an exemplary embodiment.
Figure 6B:
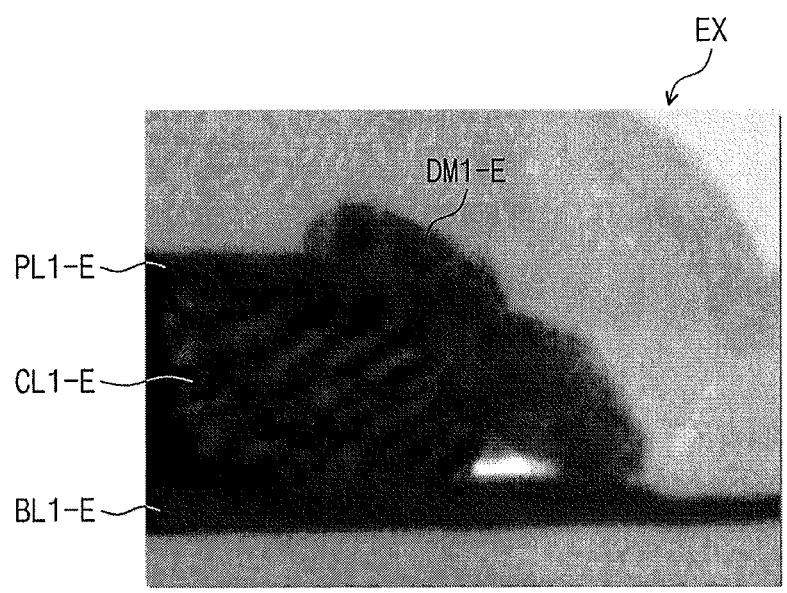
FIG. 6B illustrates a TEM image showing a portion of a thin film transistor according to a comparative example.

FIG. 6A illustrates a TEM image showing the portion of the thin film transistor according to an exemplary embodiment. FIG. 6B is a TEM image showing the portion of the thin film transistor according to a comparative example. FIGS. 6A and 6B are taken by a transmission electron microscopy (TEM).

FIGS. 6A and 6B show an area of the input electrode SE that corresponds to a side portion adjacent to the channel area CA (refer to FIG. 4). In FIGS. 6A and 6B, the same reference numerals denote the same elements in FIGS. 1 and 5A to 5I, and thus the detailed descriptions of the same elements will not be repeated.

During the plasma treatment process, the first protrusion portion PP1 may cover the side surface of the first wiring layer CL1 such that the side surface of the first wiring layer CL1 is not exposed when viewed in a plan view. Thus, the first protrusion portion PP may prevent the side surface of the first wiring layer CL1 from directly contacting the plasma gas PT. The thin film transistor TFT according to the present disclosure may further include the first protrusion portion PP1. Thus, the surface of the first wiring layer CL1 may be prevented from being damaged during the plasma treatment process.

In addition, the first protection layer PL1 may prevent the first dummy portion DM1 from increasing to the upper portion of the first wiring layer CL1. Thus, as shown in FIG. 6A, the first dummy portion DM1 may be disposed only under the first protrusion portion PP1 and may not be disposed on the first protection layer PL1. The first dummy portion DM1 may be formed on the side portion of the first wiring layer CL1 and the first dummy portion DM1 may overlap the first protrusion portion PP1 when viewed in a plan view.

In the comparative example EX illustrated in FIG. 6B, a protection layer PL1-E that corresponds to the input electrode SE does not include the first protrusion portion PP1. The protection layer PL1-E does not prevent a growth of a dummy portion DM1-E of the comparative example EX. Accordingly, the size of the dummy portion DM1-E may become greater than that of the dummy portions DM1 and DM2 according to the embodiment illustrated in FIG. 6A. The dummy portion DM1-E may grow continuously to extend to the upper portion of the protection layer PL1-E or to contact the channel area.

As described above, the dummy portion DM1-E may facilitate diffusion of the metal included in a wiring layer CL1-E. If metal diffuses to the channel area through the dummy portion DM1-E, electric charges may accumulate in the channel area, and thus the thin film transistor TFT may be deteriorated and electrical characteristics of the thin film transistor may be degraded.

Also, during the plasma treatment process, the side surface of the wiring layer CL1-E according to the comparative example EX is not covered by the protection layer PL1-E and may be directly exposed to the plasma gas. Therefore, the side surface of the wiring layer CL1-E may physically collide with the plasma gas. Accordingly, the side surface of the wiring layer CL1-E may have a non-uniform side surface as shown in FIG. 6B.

The dummy portion DM1-E and the non-uniform side surface of the wiring layer CL1-E may exert influence on layers disposed thereon. In detail, due to the dummy portion DM1-E and the non-uniform side surface of the wiring layer CL1-E, a crack may occur in the passivation layer disposed on the wiring layer CL1-E or a seam defect may occur on the passivation layer due to the dummy portion DM1-E.

On the other hand, the thin film transistor according to the present embodiment further includes the first protrusion portion PP1 on the first protection layer PL1. Accordingly, the first dummy portion DM1 may be prevented from increasing, and the surface of the first wiring layer CL1 may be prevented from being damaged due to the plasma gas.

Figure 7A:
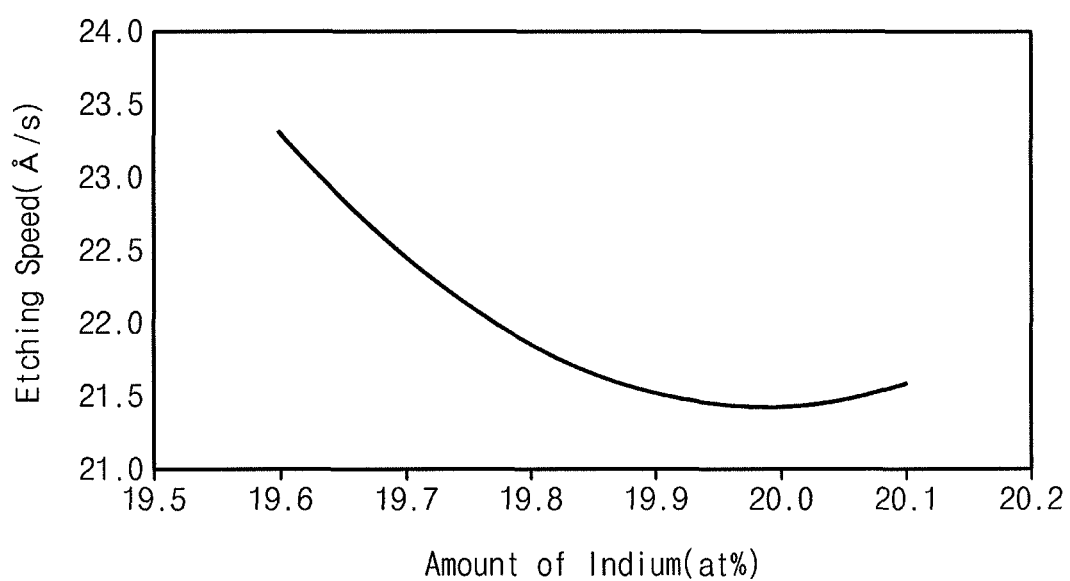
FIGS. 7A and 7B illustrate graphs showing a variation in etching speed of a protection layer according to an amount of a composition included in the protection layer.
Figure 7B:
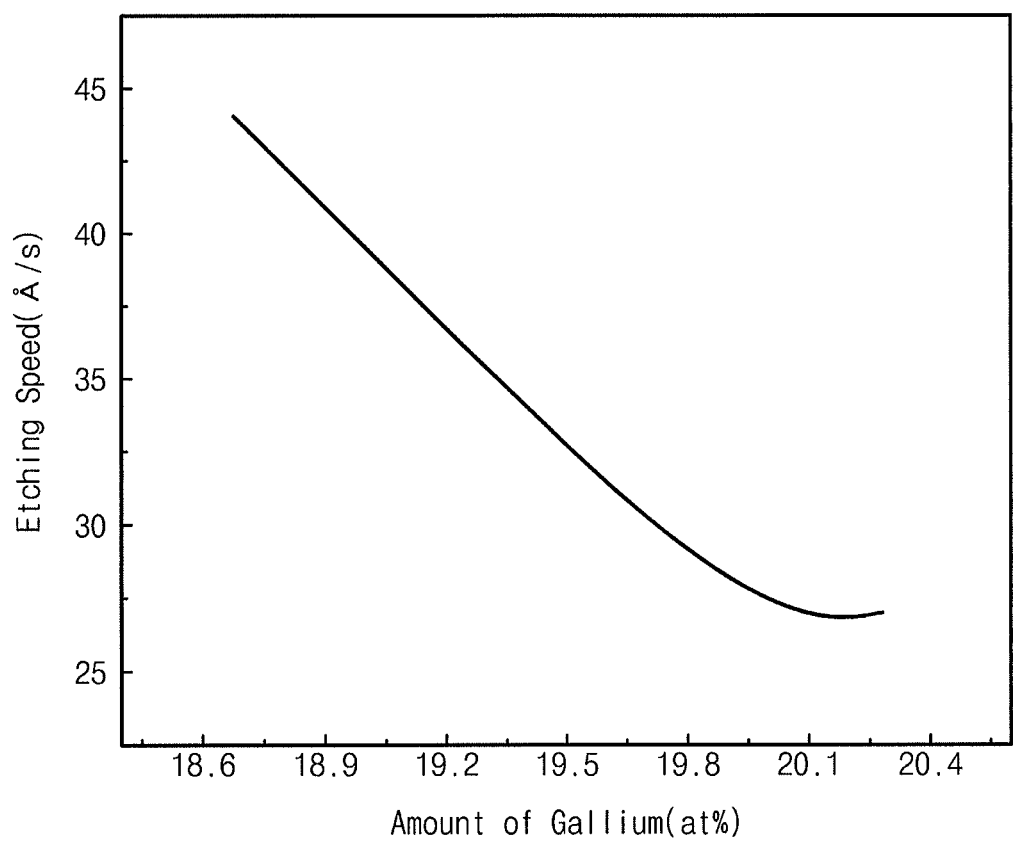

FIGS. 7A and 7B are graphs showing a variation in etching speed of the protection layer according to an amount of a composition included in the protection layer. FIG. 7A is a graph showing the variation in etching speed depending on the amount of indium (In) when the protection layers PL1 and PL2 include indium oxide, and FIG. 7B is a graph showing the variation in the etching speed depending on the amount of gallium (Ga) when the protection layers PL1 and PL2 include gallium oxide.

A method of controlling the amount of composition in the protection layers PL1 and PL2 will be described with reference to FIGS. 7A and 7B. In the thin film transistor according to embodiments the etching speed may be controlled by adjusting the amount of composition included in the protection layers PL1 and PL2.

Referring to FIG. 7A, as the amount of indium increases, the etching speed of the protection layers decreases. When the amount of indium in the protection layer is about 20.0 at % within a range of about 19 at % to about 20.2 at %, the etching speed of the protection layer has the minimum value of about 21.5 Å/s.

Referring to FIG. 7B, as the amount of gallium increases, the etching speed of the protection layer decreases. When the amount of gallium in the protection layer is about 20.1 at % within a range of about 18.6 at % to about 20.4 at %, the etching speed of the protection layer has the minimum value of about 25 Å/s.

Referring to FIGS. 7A and 7B, the etching speed of the protection layer may be controlled by adjusting the amount of indium or gallium. On the same etching condition, the protection layers PL1 and PL2 may be etched more slowly than the wiring layers CL1 and CL2. According to the present exemplary embodiment, when the amount of composition included in the protection layers PL1 and PL2 is adjusted, the protrusion portions PP and PP2 may be easily formed. In other implementations, the protrusion portions may be controlled by adjusting the crystallinity of the protection layers PL1 and PL2 in a specific direction.

By way of summation and review, a thin film transistor may serve as a switching device in a display device. A mobility of electric charges exerting influence on electrical characteristics of the thin film transistor may be determined depending on a state of a channel area, which is used as a path through which electric charge carriers move.

Embodiments provide a thin film transistor that prevents or reduces the likelihood of a channel area and input and output electrodes being damaged and provide a thin film transistor having improved electrical characteristics. Embodiments further provide a display substrate having the thin film transistor, and a method of manufacturing the display substrate.

Embodiments provide a display substrate for which deposition characteristics of a passivation material used to cover the thin film transistor are improved to prevent defects from occurring in a passivation layer.

Embodiments provide a thin film transistor that includes input and output electrodes each having a protruding portion that protrudes outwardly from a side part of a wiring layer on a protection layer when viewed in a plan view. The protruded portion prevents metal oxide from growing, thereby protecting the channel area. In addition, the protruding portion prevents the plasma gas from colliding with the input and output electrodes during a plasma treatment of the channel area, thereby protecting the input and output electrodes.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof as set forth in the following claims.

What is claimed is:

1. A thin film transistor, comprising:
a control electrode;
a semiconductor layer on the control electrode;
an input electrode, at least a portion of the input electrode being on the semiconductor layer; and
an output electrode spaced apart from the input electrode, at least a portion of the output electrode being on the semiconductor layer, each of the input electrode and the output electrode including:
a wiring layer including a metal material;
a dummy portion on a side part of the wiring layer, the dummy portion including an oxide of the metal material; and
a protection layer on the wiring layer and overlapping the wiring layer and the dummy portion, wherein a lower surface of the protection layer directly contacts an upper surface of the wiring layer and the dummy portion contacts each of the side part of the wiring layer and the lower surface of the protection layer, wherein the upper surface of the wiring layer and an upper surface of the dummy portion are coplanar.

2. The thin film transistor as claimed in claim 1, wherein the semiconductor layer includes an oxide semiconductor.

3. The thin film transistor as claimed in claim 1, wherein the protection layer includes:
a first portion overlapping the wiring layer; and
a second portion connected to the first portion and overlapping the dummy portion, the second portion protruding outwardly from the wiring layer when viewed in a plan view.

4. The thin film transistor as claimed in claim 3, wherein the semiconductor layer includes an input area overlapping the input electrode, an output area overlapping the output electrode, and a channel area between the input area and the output area, the second portion of the protection layer being disposed adjacent to the channel area.

5. The thin film transistor as claimed in claim 4, wherein:
the input area entirely overlaps the input electrode, and
the output area entirely overlaps the output electrode.

6. The thin film transistor as claimed in claim 5, wherein an upper surface of the channel area is recessed more than an upper surface of the input area and an upper surface of the output area.

7. The thin film transistor as claimed in claim 4, wherein a length of the second portion that protrudes outwardly from the wiring layer is in a range of from about 1.25% to about 5% of a width of the wiring layer.

8. The thin film transistor as claimed in claim 1, wherein the metal material included in the wiring layer is copper or a copper alloy.

9. The thin film transistor as claimed in claim 1, wherein the protection layer includes at least one of indium-zinc oxide, gallium-zinc oxide, and aluminum-zinc oxide.

10. The thin film transistor as claimed in claim 1, wherein each of the input electrode and the output electrode further includes a barrier layer disposed between the semiconductor layer and the wiring layer, the barrier layer including at least one of indium-zinc oxide, gallium-zinc oxide, and aluminum-zinc oxide.

11. The thin film transistor as claimed in claim 1, wherein a width of the dummy portion increases from the protection layer towards the semiconductor layer.

12. A display substrate, comprising:
a base substrate;
a thin film transistor including a first electrode layer on the base substrate, a semiconductor layer on the first electrode layer, the semiconductor layer including an oxide semiconductor, and a second electrode layer, at least a portion of the second electrode layer being on the semiconductor layer; and
a pixel electrode electrically connected to the thin film transistor,
wherein the second electrode layer includes:
a wiring layer including a metal material;
a dummy portion on a side part of the wiring layer, the dummy portion including an oxide of the metal material; and
a protection layer on the wiring layer, the protection layer overlapping the wiring layer and the dummy portion, wherein the protection layer contacts each of an upper surface of the dummy portion and of the wiring layer, and the protection layer is spaced apart from the semiconductor layer in a cross-sectional view.

13. The display substrate as claimed in claim 12, wherein the protection layer includes:
a first portion overlapping the wiring layer; and
a second portion connected to the first portion and overlapping the dummy portion, the second portion protruding outwardly from the wiring layer when viewed in a plan view.

14. The display substrate as claimed in claim 13, wherein the protection layer includes at least one of indium-zinc oxide, gallium-zinc oxide, and aluminum-zinc oxide.

15. The display substrate as claimed in claim 14, wherein the second electrode layer further includes a barrier layer between the semiconductor layer and the wiring layer, the barrier layer including at least one of indium-zinc oxide, gallium-zinc oxide, and aluminum-zinc oxide.

16. The display substrate as claimed in claim 12, wherein the second electrode layer includes an input electrode and an output electrode that are spaced apart from each other.

17. The display substrate as claimed in claim 16, further comprising:
a gate line on the base substrate, the gate line extending in a first direction and being connected to the second electrode layer; and
a data line on the base substrate, the data line extending in a second direction substantially perpendicular to the first direction and being connected to the first electrode layer, wherein the data line has a same structure as the second electrode layer and entirely overlaps the semiconductor layer.

18. The display substrate as claimed in claim 12, wherein a width of the dummy portion increases from the protection layer towards the semiconductor layer.

19. The display substrate as claimed in claim 12, wherein protection layer directly contacts the wiring layer and the upper surface of the dummy portion doesn't overlap the upper surface of the wiring layer in a plan view.

* * * * *